United States Patent
Isobe et al.

(10) Patent No.: US 7,656,225 B2
(45) Date of Patent: Feb. 2, 2010

(54) VOLTAGE GENERATION CIRCUIT AND SEMICONDUCTOR MEMORY DEVICE INCLUDING THE SAME

(75) Inventors: Katsuaki Isobe, Kanagawa (JP); Noboru Shibata, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/739,397

(22) Filed: Apr. 24, 2007

(65) Prior Publication Data

US 2007/0247133 A1   Oct. 25, 2007

(30) Foreign Application Priority Data

Apr. 24, 2006   (JP)   ............................. 2006-119772

(51) Int. Cl.
*G05F 1/10* (2006.01)
*G05F 3/02* (2006.01)

(52) U.S. Cl. .................. 327/540; 327/541; 323/281

(58) Field of Classification Search ................. 327/540, 327/541; 323/281
See application file for complete search history.

(56) References Cited

U.S. PATENT DOCUMENTS 6,531,914 B2 *   3/2003   Kawakubo .................. 327/541
2001/0011886 A1 *   8/2001   Kobayashi .................. 323/281
2007/0001753 A1 *   1/2007   Byeon ........................ 327/541

FOREIGN PATENT DOCUMENTS

JP   2001-242949   9/2001

* cited by examiner

*Primary Examiner*—Lincoln Donovan
*Assistant Examiner*—John W Poos
(74) *Attorney, Agent, or Firm*—Oblon, Spivak, McClelland, Maier & Neustadt, L.L.P.

(57) ABSTRACT

A voltage generation circuit comprises a reference voltage generation circuit; a differential amplifier; an output node; a P-channel MOS transistor; a first resistor series; a second resistor series; a third resistor series; and a selection control circuit. A reference voltage generated by the reference voltage generation circuit is input to a first input terminal of the differential amplifier. The first resistor series is connected between a drain of the P-channel MOS transistor and the output node. The second resistor series is connected between the output node and a second input terminal of the differential amplifier. The third resistor array is connected between the second input terminal of the differential amplifier and a ground. The selection control circuit controls such that a sum of the resistances of the first resistor series and the second resistor series is constant.

15 Claims, 15 Drawing Sheets

Fig.8

V=2, N=4, T=8, VREF=0.8V

| v⟨2⟩ | v⟨1⟩ | v⟨0⟩ | us⟨3⟩<br>ds⟨3⟩ | us⟨2⟩<br>ds⟨2⟩ | us⟨1⟩<br>ds⟨1⟩ | us⟨0⟩<br>ds⟨0⟩ | Rd | Ru | Rd+Ru | VCGRV |
|---|---|---|---|---|---|---|---|---|---|---|
| 0 | 0 | 0 | 1 | 0 | 0 | 0 | 10R | 11R | 11R | 0.8V |
| 0 | 0 | 0 | 1 | 0 | 0 | 1 | 01R | 10R | 11R | 0.9V |
| 0 | 0 | 0 | 1 | 0 | 1 | 0 | 02R | 9R | 11R | 1.0V |
| 0 | 0 | 0 | 1 | 0 | 1 | 1 | 03R | 8R | 11R | 1.1V |
| 0 | 0 | 1 | 0 | 1 | 0 | 0 | 14R | 7R | 11R | 1.2V |
| 0 | 0 | 1 | 0 | 0 | 0 | 1 | 05R | 6R | 11R | 1.3V |
| 0 | 0 | 1 | 0 | 0 | 1 | 0 | 06R | 5R | 11R | 1.4V |
| 0 | 1 | 1 | 0 | 1 | 0 | 0 | 07R | 4R | 11R | 1.5V |
| 1 | 0 | 0 | 0 | 0 | 0 | 0 | 18R | 3R | 11R | 1.6V |
| 1 | 0 | 0 | 0 | 0 | 0 | 1 | 09R | 2R | 11R | 1.7V |
| 1 | 1 | 0 | 0 | 0 | 1 | 0 | 010R | 1R | 11R | 1.8V |
| 1 | 1 | 0 | 0 | 0 | 0 | 0 | 011R | 0R | 11R | 1.9V |

Fig.9

M=7, T=8, VREF=0.8V

| us<7> ds<7> | us<6> ds<6> | us<5> ds<5> | us<4> ds<4> | us<3> ds<3> | us<2> ds<2> | us<1> ds<1> | us<0> ds<0> | Rd | Ru | Rd+Ru | VCGRV |
|---|---|---|---|---|---|---|---|---|---|---|---|
| 0 | 0 | 0 | 0 | 0 | 0 | 0 | 0 | 0R | 7R | 7R | 0.8V |
| 0 | 0 | 0 | 0 | 0 | 0 | 0 | 1 | 1R | 6R | 7R | 0.9V |
| 0 | 0 | 0 | 0 | 0 | 0 | 1 | 0 | 2R | 5R | 7R | 1.0V |
| 0 | 0 | 0 | 0 | 0 | 1 | 0 | 0 | 3R | 4R | 7R | 1.1V |
| 0 | 0 | 0 | 0 | 1 | 0 | 0 | 0 | 4R | 3R | 7R | 1.2V |
| 0 | 0 | 0 | 1 | 0 | 0 | 0 | 0 | 5R | 2R | 7R | 1.3V |
| 0 | 0 | 1 | 0 | 0 | 0 | 0 | 0 | 6R | 1R | 7R | 1.4V |
| 0 | 1 | 0 | 0 | 0 | 0 | 0 | 0 | 7R | 0R | 7R | 1.5V |

Fig.10

V=2, N=2, T=8, VREF=0.8V

| v<2> | v<1> | v<0> | us<2>/ds<2> | us<1>/ds<1> | us<0>/ds<0> | Rd | Ru | Rd+Ru | VCGRV |
|---|---|---|---|---|---|---|---|---|---|
| 0 | 0 | 0 | 1 | 1 | 1 | 0R | 23R | 23R | 0.8V |
| 0 | 0 | 0 | 1 | 1 | 1 | 1R | 22R | 23R | 0.9V |
| 0 | 0 | 0 | 1 | 1 | 0 | 2R | 21R | 23R | 1.0V |
| 0 | 0 | 0 | 1 | 1 | 0 | 3R | 20R | 23R | 1.1V |
| 0 | 0 | 0 | 1 | 0 | 1 | 4R | 19R | 23R | 1.2V |
| 0 | 0 | 0 | 1 | 0 | 1 | 5R | 18R | 23R | 1.3V |
| 0 | 0 | 0 | 1 | 0 | 0 | 6R | 17R | 23R | 1.4V |
| 0 | 0 | 0 | 1 | 0 | 0 | 7R | 16R | 23R | 1.5V |
| 0 | 0 | 1 | 0 | 1 | 1 | 8R | 15R | 23R | 1.6V |
| 0 | 0 | 1 | 0 | 1 | 1 | 9R | 14R | 23R | 1.7V |
| 0 | 0 | 1 | 0 | 1 | 0 | 10R | 13R | 23R | 1.8V |
| 0 | 0 | 1 | 0 | 1 | 0 | 11R | 12R | 23R | 1.9V |
| 0 | 0 | 1 | 0 | 0 | 1 | 12R | 11R | 23R | 2.0V |
| 0 | 0 | 1 | 0 | 0 | 1 | 13R | 10R | 23R | 2.1V |
| 0 | 0 | 1 | 0 | 0 | 0 | 14R | 9R | 23R | 2.2V |
| 0 | 0 | 1 | 0 | 0 | 0 | 15R | 8R | 23R | 2.3V |
| 0 | 1 | 0 | 0 | 1 | 1 | 16R | 7R | 23R | 2.4V |
| 0 | 1 | 0 | 0 | 1 | 1 | 17R | 6R | 23R | 2.5V |
| 0 | 1 | 0 | 0 | 1 | 0 | 18R | 5R | 23R | 2.6V |
| 0 | 1 | 0 | 0 | 1 | 0 | 19R | 4R | 23R | 2.7V |
| 0 | 1 | 0 | 0 | 0 | 1 | 20R | 3R | 23R | 2.8V |
| 0 | 1 | 0 | 0 | 0 | 1 | 21R | 2R | 23R | 2.9V |
| 0 | 1 | 0 | 0 | 0 | 0 | 22R | 1R | 23R | 3.0V |
| 0 | 1 | 0 | 0 | 0 | 0 | 23R | 0R | 23R | 3.1V |

Fig.11

V=1, n=4, T=8, VREF=0.8V

| uv<1>/dv<1> | uv<0>/dv<0> | us<3>/ds<3> | us<2>/ds<2> | us<1>/ds<1> | us<0>/ds<0> | Rd | Ru | Rd+Ru | VCGRV |
|---|---|---|---|---|---|---|---|---|---|
| 1 | 1 | 1 | 0 | 0 | 0 | 0R | 15R | 15R | 0.8V |
| 1 | 1 | 1 | 0 | 0 | 1 | 1R | 14R | 15R | 0.9V |
| 1 | 1 | 1 | 0 | 1 | 0 | 2R | 13R | 15R | 1.0V |
| 1 | 1 | 1 | 1 | 0 | 0 | 3R | 12R | 15R | 1.1V |
| 1 | 0 | 0 | 0 | 0 | 0 | 4R | 11R | 15R | 1.2V |
| 1 | 0 | 0 | 0 | 0 | 1 | 5R | 10R | 15R | 1.3V |
| 1 | 0 | 0 | 0 | 1 | 0 | 6R | 9R | 15R | 1.4V |
| 1 | 0 | 0 | 1 | 0 | 0 | 7R | 8R | 15R | 1.5V |
| 0 | 1 | 1 | 0 | 0 | 0 | 8R | 7R | 15R | 1.6V |
| 0 | 1 | 1 | 0 | 0 | 1 | 9R | 6R | 15R | 1.7V |
| 0 | 1 | 1 | 0 | 1 | 0 | 10R | 5R | 15R | 1.8V |
| 0 | 1 | 1 | 1 | 0 | 0 | 11R | 4R | 15R | 1.9V |
| 0 | 0 | 0 | 0 | 0 | 0 | 12R | 3R | 15R | 2.0V |
| 0 | 0 | 0 | 0 | 0 | 1 | 13R | 2R | 15R | 2.1V |
| 0 | 0 | 0 | 0 | 1 | 0 | 14R | 1R | 15R | 2.2V |
| 0 | 0 | 0 | 1 | 0 | 0 | 15R | 0R | 15R | 2.3V |

Fig.12

N=2, T=8, VREF=0.8V

| uv<2><br>dv<2> | uv<1><br>dv<1> | uv<0><br>nv<0> | Rd | Ru | Rd+Ru | VCGRV |
|---|---|---|---|---|---|---|
| 1 | 1 | 1 | 0R | 7R | 7R | 0.8V |
| 1 | 1 | 0 | 1R | 6R | 7R | 0.9V |
| 1 | 0 | 1 | 2R | 5R | 7R | 1.0V |
| 1 | 0 | 0 | 3R | 4R | 7R | 1.1V |
| 0 | 1 | 1 | 4R | 3R | 7R | 1.2V |
| 0 | 1 | 0 | 5R | 2R | 7R | 1.3V |
| 0 | 0 | 1 | 6R | 1R | 7R | 1.4V |
| 0 | 0 | 0 | 7R | 0R | 7R | 1.5V |

Fig.13

L=3, M=3, N=4, T=8, VREF=0.8V

| w<2> | w<1> | w<0> | uv<2>/dv<2> | uv<1>/dv<1> | uv<0>/dv<0> | us<3>/ds<3> | us<2>/ds<2> | us<1>/ds<1> | us<0>/ds<0> | Rd | Ru | Rd+Ru | VCGRV |
|---|---|---|---|---|---|---|---|---|---|---|---|---|---|
| 0 | 0 | 0 | 1 | 0 | 0 | 0 | 0 | 0 | 0 | 10R | 35R | 35R | 0.8V |
| 0 | 0 | 0 | 1 | 0 | 0 | 0 | 0 | 0 | 1 | 01R | 34R | 35R | 0.9V |
| 0 | 0 | 0 | 1 | 0 | 0 | 0 | 0 | 1 | 0 | 02R | 33R | 35R | 1.0V |
| 0 | 0 | 0 | 1 | 0 | 0 | 0 | 1 | 0 | 0 | 03R | 32R | 35R | 1.1V |
| 0 | 0 | 0 | 1 | 0 | 0 | 0 | 0 | 0 | 1 | 14R | 31R | 35R | 1.2V |
| 0 | 0 | 0 | 1 | 0 | 1 | 0 | 0 | 0 | 0 | 05R | 30R | 35R | 1.3V |
| 0 | 0 | 0 | 1 | 0 | 1 | 0 | 0 | 0 | 1 | 06R | 29R | 35R | 1.4V |
| 0 | 0 | 0 | 1 | 0 | 1 | 0 | 0 | 1 | 0 | 07R | 28R | 35R | 1.5V |
| 0 | 0 | 0 | 1 | 0 | 1 | 0 | 1 | 0 | 0 | 18R | 27R | 35R | 1.6V |
| 0 | 0 | 0 | 1 | 0 | 1 | 1 | 0 | 0 | 0 | 09R | 26R | 35R | 1.7V |
| 0 | 0 | 1 | 1 | 1 | 0 | 0 | 0 | 0 | 0 | 010R | 25R | 35R | 1.8V |
| 0 | 0 | 1 | 1 | 1 | 0 | 0 | 0 | 0 | 1 | 11R | 24R | 35R | 1.9V |
| 0 | 0 | 1 | 1 | 1 | 0 | 0 | 0 | 1 | 0 | 12R | 23R | 35R | 2.0V |
| 0 | 0 | 1 | 1 | 1 | 0 | 0 | 1 | 0 | 0 | 13R | 22R | 35R | 2.1V |
| 0 | 0 | 1 | 1 | 1 | 0 | 1 | 0 | 0 | 0 | 014R | 21R | 35R | 2.2V |
| 0 | 0 | 1 | 1 | 1 | 1 | 0 | 0 | 0 | 0 | 15R | 20R | 35R | 2.3V |
| 0 | 0 | 1 | 1 | 1 | 1 | 0 | 0 | 0 | 1 | 16R | 19R | 35R | 2.4V |
| 0 | 0 | 1 | 1 | 1 | 1 | 0 | 0 | 1 | 0 | 17R | 18R | 35R | 2.5V |
| 0 | 0 | 1 | 1 | 1 | 1 | 0 | 1 | 0 | 0 | 018R | 17R | 35R | 2.6V |
| 0 | 0 | 1 | 1 | 1 | 1 | 1 | 0 | 0 | 0 | 19R | 16R | 35R | 2.7V |
| 1 | 1 | 0 | 0 | 0 | 0 | 0 | 0 | 0 | 0 | 020R | 15R | 35R | 2.8V |
| 1 | 1 | 0 | 0 | 0 | 0 | 0 | 0 | 0 | 1 | 21R | 14R | 35R | 2.9V |
| 1 | 1 | 0 | 0 | 0 | 0 | 0 | 0 | 1 | 0 | 022R | 13R | 35R | 3.0V |
| 1 | 1 | 0 | 0 | 0 | 0 | 0 | 1 | 0 | 0 | 023R | 12R | 35R | 3.1V |
| 1 | 1 | 0 | 0 | 0 | 0 | 1 | 0 | 0 | 0 | 024R | 11R | 35R | 3.2V |
| 1 | 1 | 0 | 0 | 0 | 1 | 0 | 0 | 0 | 0 | 025R | 10R | 35R | 3.3V |
| 1 | 1 | 0 | 0 | 0 | 1 | 0 | 0 | 0 | 1 | 026R | 9R | 35R | 3.4V |
| 1 | 1 | 0 | 0 | 0 | 1 | 0 | 0 | 1 | 0 | 027R | 8R | 35R | 3.5V |
| 1 | 1 | 0 | 0 | 0 | 1 | 0 | 1 | 0 | 0 | 128R | 7R | 35R | 3.6V |
| 1 | 1 | 0 | 0 | 0 | 1 | 1 | 0 | 0 | 0 | 029R | 6R | 35R | 3.7V |
| 1 | 1 | 1 | 0 | 1 | 0 | 0 | 0 | 0 | 0 | 030R | 5R | 35R | 3.8V |
| 1 | 1 | 1 | 0 | 1 | 0 | 0 | 0 | 0 | 1 | 131R | 4R | 35R | 3.9V |
| 1 | 1 | 1 | 0 | 1 | 0 | 0 | 0 | 1 | 0 | 032R | 3R | 35R | 4.0V |
| 1 | 1 | 1 | 0 | 1 | 0 | 0 | 1 | 0 | 0 | 033R | 2R | 35R | 4.1V |
| 1 | 1 | 1 | 0 | 1 | 0 | 1 | 0 | 0 | 0 | 034R | 1R | 35R | 4.2V |
| 1 | 1 | 1 | 0 | 1 | 1 | 0 | 0 | 0 | 0 | 035R | 0R | 35R | 4.3V |

VOLTAGE GENERATION CIRCUIT AND SEMICONDUCTOR MEMORY DEVICE INCLUDING THE SAME

CROSS-REFERENCE TO RELATED APPLICATIONS

This application is based upon and claims the benefit of priority from the prior Japanese Patent Application No. 2006-119772, filed on Apr. 24, 2006, the entire content of which is incorporated herein by reference.

BACKGROUND OF THE INVENTION

1. Field of the Invention

The present invention relates to a voltage generation circuit for generating a plurality of voltages in a stepped-up manner and a semiconductor memory device including the same.

2. Description of the Related Art

A conventional semiconductor memory device generates a voltage necessary for writing, erasing or reading data by an internal voltage generation circuit within a chip since the power has now become provided by a single power supply. The internal voltage generation circuit is constructed to be capable of setting a plurality of voltage levels in a stepped-up manner.

The internal voltage generation circuit includes a voltage adjusting circuit for adjusting a power externally provided to a desired output voltage level.

For setting a plurality of voltage levels in a stepped-up manner, a conventional semiconductor memory device requires as many transfer gates as voltage levels to be set (see, for example, Japanese Laid-Open Patent Publication No. 2001-242949).

SUMMARY OF THE INVENTION

The present invention provides a voltage generation circuit for providing an output voltage adjusted with a high degree of accuracy with a small circuit area, and a semiconductor memory device including such a voltage generation circuit.

According to one embodiment of the present invention, a voltage generation circuit comprises:

a reference voltage generation circuit for generating a reference voltage;

a differential amplifier having a first input terminal, a second input terminal, and an output terminal;

an output node for outputting an output voltage;

a P-channel MOS transistor having a source, a drain, and a gate;

a first resistor series a second resistor series;

a third resistor series; and a selection control circuit for selecting a resistance of the first resistor series, a resistance of the second resistor series, and a resistance of the third resistor series.

The output terminal of the differential amplifier is connected to the gate of the P-channel MOS transistor.

The source of the P-channel MOS transistor is connected to a power supply.

The reference voltage generated by the reference voltage generation circuit is input to the first input terminal of the differential amplifier.

The first resistor series is connected between the drain of the P-channel MOS transistor and the output node.

The second resistor series is connected between the output node and the second input terminal of the differential amplifier.

The third resistor array is connected between the second input terminal of the differential amplifier and a ground.

According to another embodiment of the present invention, a voltage generation circuit comprises:

a reference voltage generation circuit for generating a reference voltage;

a differential amplifier having a first input terminal, a second input terminal, and an output terminal;

a P-channel MOS transistor having a source, a drain, and a gate;

an output node for outputting an output voltage;

a first voltage adjusting circuit; and a second voltage adjusting circuit.

The reference voltage is input to the first input terminal of the differential amplifier.

The output terminal of the differential amplifier is connected to the gate of the P-channel MOS transistor.

The source of the P-channel MOS transistor is connected to a power supply.

The first voltage adjusting circuit is connected between the drain of the P-channel MOS transistor and the second input terminal of the differential amplifier.

The second voltage adjusting circuit is connected between the second input terminal of the differential amplifier and a ground.

Thus, the present invention provides a voltage generation circuit for providing an output voltage adjusted with a high degree of accuracy with a small circuit area, and a semiconductor memory device including such a voltage generation circuit.

BRIEF DESCRIPTION OF THE DRAWINGS

FIG. 8 shows the relationship between the control signals and the voltage VCGRV in an exemplary voltage generation circuit according to the second embodiment of the present invention;

FIG. 9 shows the relationship between the control signals and the voltage VCGRV in an exemplary voltage generation circuit according to the third embodiment of the present invention;

FIG. 10 shows the relationship between the control signals and the voltage VCGRV in an exemplary voltage generation circuit according to the fourth embodiment of the present invention;

FIG. 11 shows the relationship between the control signals and the voltage VCGRV in an exemplary voltage generation circuit according to the fifth embodiment of the present invention;

FIG. 12 shows the relationship between the control signals and the voltage VCGRV in an exemplary voltage generation circuit according to the sixth embodiment of the present invention;

FIG. 13 shows the relationship between the control signals and the voltage VCGRV in an exemplary voltage generation circuit according to the seventh embodiment of the present invention;

DESCRIPTION OF THE PREFERRED EMBODIMENTS

Hereinafter, the present invention will be described by way of embodiments with reference to the attached drawings. The present invention can be carried out in various embodiments and is not limited to the following embodiments in any way.

Figure 14:
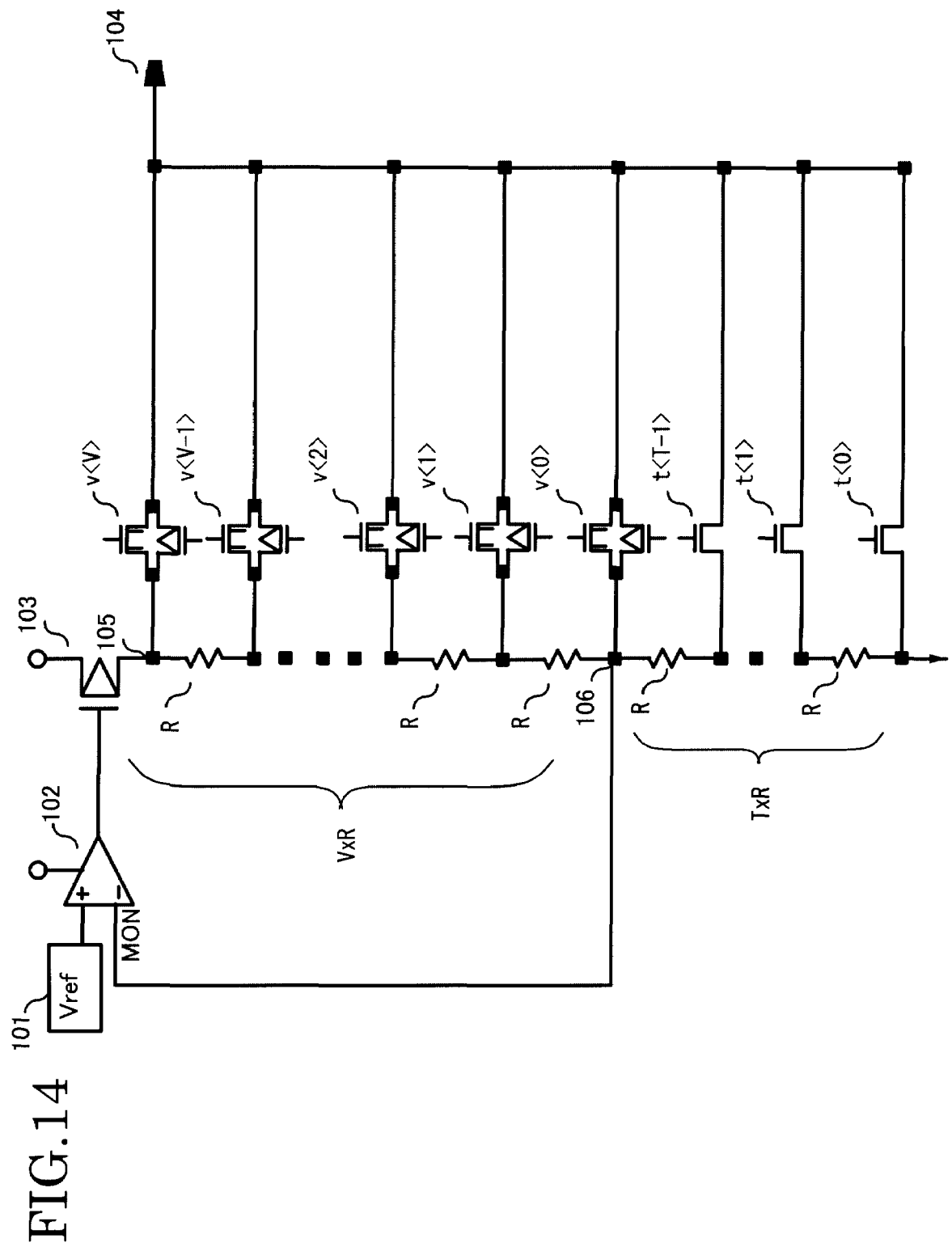
FIG. 14 shows a conventional voltage generation circuit.

FIG. 14 shows an exemplary conventional voltage generation circuit. As shown in FIG. 14, the voltage generation circuit includes a differential amplifier 102, a P-channel MOS transistor 103, resistors and switching transistors.

A reference voltage (Vref) is input to a non-inverted input of the differential amplifier 102 from a reference generation circuit 101. An output from the differential amplifier 102 is fed back to an inverted input MON via the P-channel MOS transistor 103, the resistors (feedback resistors) $Ru_1 \sim Ru_{(v-1)}$ and a node 106. Resistors $Rd_1 \sim Rd_{(T-1)}$ are connected between the inverted input MON 106 and a ground.

In this state, the differential amplifier 102 operates such that the Vref to be input to the non-inverted input thereof and a potential to be input inverted to the inverted input MON are equal to each other. A current flowing through the feedback resistors $Ru_1 \sim Ru_{(v-1)}$ by the activation of the P-channel MOS transistor 103 mostly flows into the resistors $Rd_1 \sim Rd_{(T-1)}$ and does not flow into the inverted input MON of the differential amplifier 102. Therefore, the current flowing through the feedback resistors $Ru_1 \sim Ru_{(v-1)}$ is represented by the following expression (1).

$$I = Vref/(T \times R) \qquad (1)$$

Here, T represents the number of resistors connected between the inverted input MON and the ground, and R represents a resistance of each resistor. Hereinafter, T represents the number of resistors connected between the inverted input MON and the ground unless otherwise specified.

When the P-channel MOS transistor 103 is activated, a voltage (Vout) at a drain 105 of the P-channel MOS transistor 103 is determined by the ratio between the resistance of a series T×R of the resistors $Rd_1 \sim Rd_{(T-1)}$ and the resistance of a series V×R of the feedback resistors $Ru_1 \sim Ru_{(v-1)}$, and is represented by the following expression (2).

$$Vout = Vref \times (1 + (V \times R/T \times R)) \qquad (2)$$

Accordingly, the voltage (Vout) at the drain 105 of the P-channel transistor 103 and the voltage (VCGRV) at an output node 104 can be adjusted by making the resistance of the series V×R of the feedback resistors or the resistance of the series T×R of the resistors variable.

The resistance of the series V×R of the feedback resistors or the resistance of the series T×R of the resistors can be made variable by a method described below. The feedback resistors $Ru_1 \sim Ru_{(v-1)}$ are arranged in series, and the resistors $Rd_1 \sim Rd_{(T-1)}$ are arranged in series. A resistor and another resistor of the resistors arranged in series are connected to each other via a switching transistor. The number of resistors is varied by selecting a switching transistor(s) to be turned on (or off). The output node 104 is connected to a connection node of each of the feedback resistors $Ru_1 \sim Ru_{(v-1)}$ and a connection node of each of the resistors $Rd_1 \sim Rd_{(T-1)}$. Therefore, when any of the switching transistors for varying the number of the resistors of the series V×R of the feedback resistors is selected, all the switching transistors for varying the number of the resistors of the series T×R of the resistors are turned off. Hereinafter, such a state will be referred to as "VCGRV≧Vref mode" for the sake of convenience. When any of the switching transistors for varying the number of the resistors of the series T×R of the resistors is selected, all the switching transistors for varying the number of the resistors of the series V×R of the feedback resistors V×R are turned off. Hereinafter, such a state will be referred to as "VCGRV<Vref mode".

In FIG. 14, in the VCGRV<Vref mode, the voltage (VCGRV) at the output node 104 is represented by the following expression (3).

$$VCGRV = Vref \times (t/T) \qquad (3)$$

where t=0, 1, 2, . . . , T−1.

Again in FIG. 14, in the VCGRV≧Vref mode, the voltage (VCGRV) at the output node 104 is represented by the following expression (4).

$$VCGRV = Vref \times (1 + v/T) \qquad (4)$$

where v=0, 1, 2, . . . , V.

For obtaining a voltage VCGRV lower than Vref, the VCGRV<Vref mode is selected. For obtaining a voltage VCGRV equal to or higher than Vref, the VCGRV≧Vref mode is selected. How many levels of voltages can be provided for selection is determined by the number (T) of the resistors of the series T×R of the resistors and the number (V) of the resistors of the series V×R of the feedback resistors.

In order to adjust the voltage with small steps in the VCGRV≧Vref mode, a number of transfer gates which is larger by one than the number of the steps ((V+1) transfer gates) are necessary. Since a transfer gate uses an N-channel MOS transistor and a P-channel MOS transistor, such an arrangement enlarges the circuit scale. In order to avoid the gate voltage of each transfer gate from becoming lower than the threshold level of the N-channel MOS transistor, it may be necessary to shift the gate voltage to a higher level. In such a case, a control circuit including a level shifter for the gate voltage is also required, which further enlarges the circuit scale. Since the provision of the transfer gates increases the parasitic load, the stability of the feedback circuit may be spoiled. In order to solve these inconveniences, the present invention provides a voltage generation circuit having the following circuit configuration in one embodiment.

Embodiment 1

Figure 1:
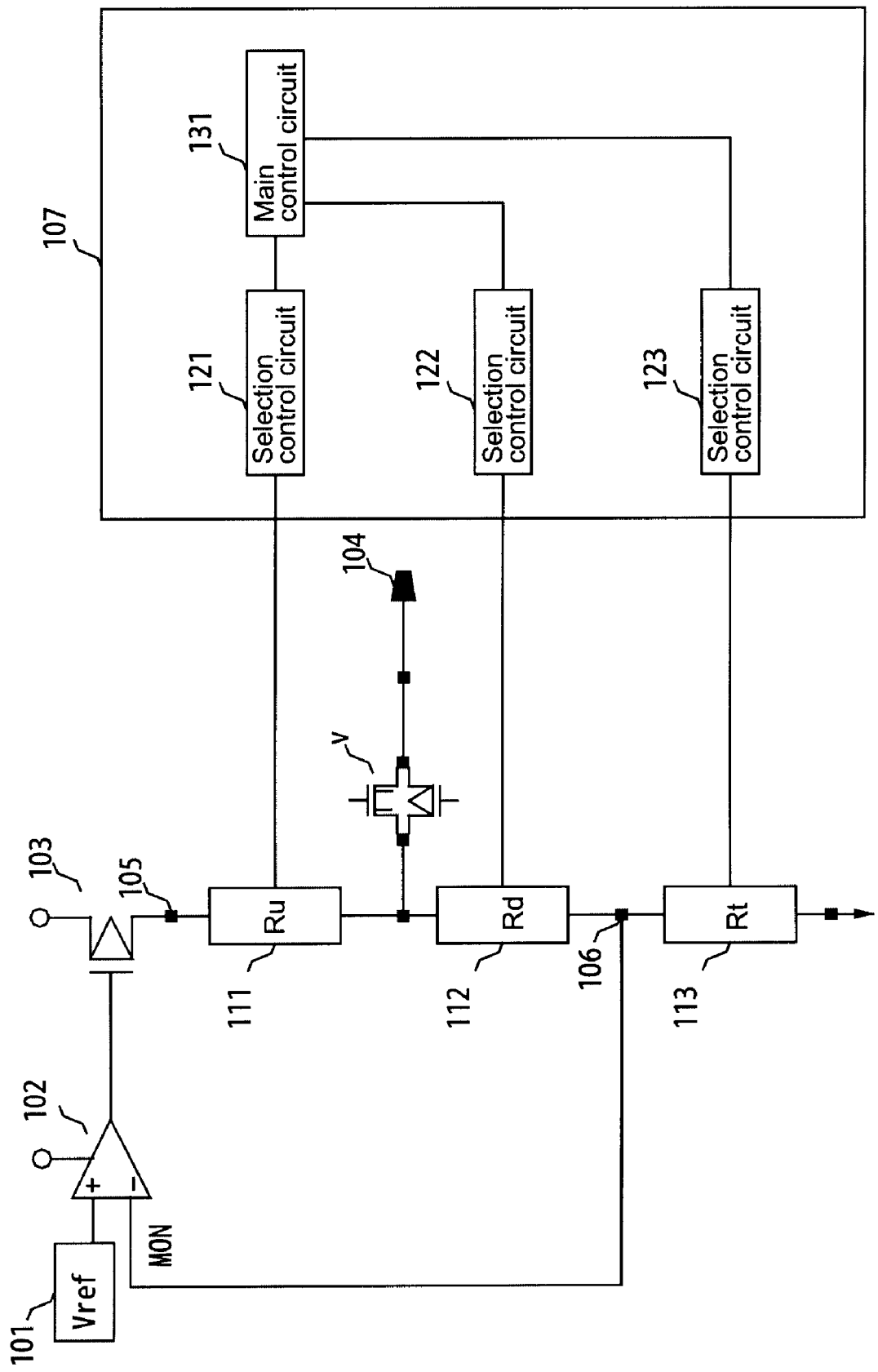
FIG. 1 is a schematic view of a voltage generation circuit according to a first embodiment of the present invention.

FIG. 1 is a schematic view of a voltage generation circuit according to a first embodiment of the present invention. The voltage generation circuit according to the first embodiment of the present invention includes a reference voltage generation circuit 101, a differential amplifier 102, a P-channel MOS transistor (MP1) 103, a first resistor series Ru 111, a second resistor series Rd 112, a third resistor series Rt 113, a transfer gate v, and a control section 107. The control section 107 includes a first selection control circuit 121 for selecting a resistor(s) from the first resistor series 111, a second selection control circuit 122 for selecting a resistor(s) from the second resistor series 111, a third selection control circuit 123 for selecting a resistor(s) from the third resistor series array 113, and main control circuit.

The control section 107 controls such that the sum of the resistance Rd of the second resistor series Rd 112 provided between a MON and an output node 104 and the resistance Ru of the first resistor series Ru 111 provided between the output node 104 and a drain 105 of the P-channel MOS (MP1) is kept constant regardless of the level of the voltage VCGRV at the output node 104. The control section 107 controls in the same manner in second through seventh embodiments described later.

Even if the first resistor series Ru 111 and the second resistor series Rd 112 have different resistances, as long as the sum thereof is controlled to be constant, the voltage at the MON compared by the differential amplifier 102, Vds and Vgs of the P-channel MOS transistor (MP1) 103, and the potential relationship among a stable state of the differential amplifier 102 can be kept constant regardless of the level of the voltage VCGRV at the output node 104.

This will be described more specifically. The current flowing when the P-channel MOS transistor (MP1) 103 is activated is represented as I=Vref/Rt, where Rt represents the resistance of the third resistor series Rt 113. Accordingly, where Rt and Vref are constant, the current I is kept constant. Where Rd+Ru is constant, the voltage at the drain 105 of the P-channel MOS transistor (MP1) 103, which is represented as MON+I×(Rd+Ru), is also kept constant. Where Vds of the P-channel MOS transistor (MP1) 103 and the current I are constant, Vgs is constant. Therefore, the output from the differential amplifier 102 is also constant and the differential amplifier 102 stably operates with Vref=MON. The input and output of the differential amplifier 102 are equal to each other. As a result, the potential relationship at the stable state of the differential amplifier 102 is constant regardless of the level of the voltage VCGRV.

The conventional voltage generation circuit has the problem of requiring a number of transfer gates corresponding to the number of voltage levels to be set and thus enlarging the circuit scale. In the voltage generation circuit according to the first embodiment of the present invention, Rd+Ru is kept constant, so that a plurality of stages of signals are used for selecting the resistance. Thus, the number of required transfer gates is reduced.

Embodiment 2

Figure 2:
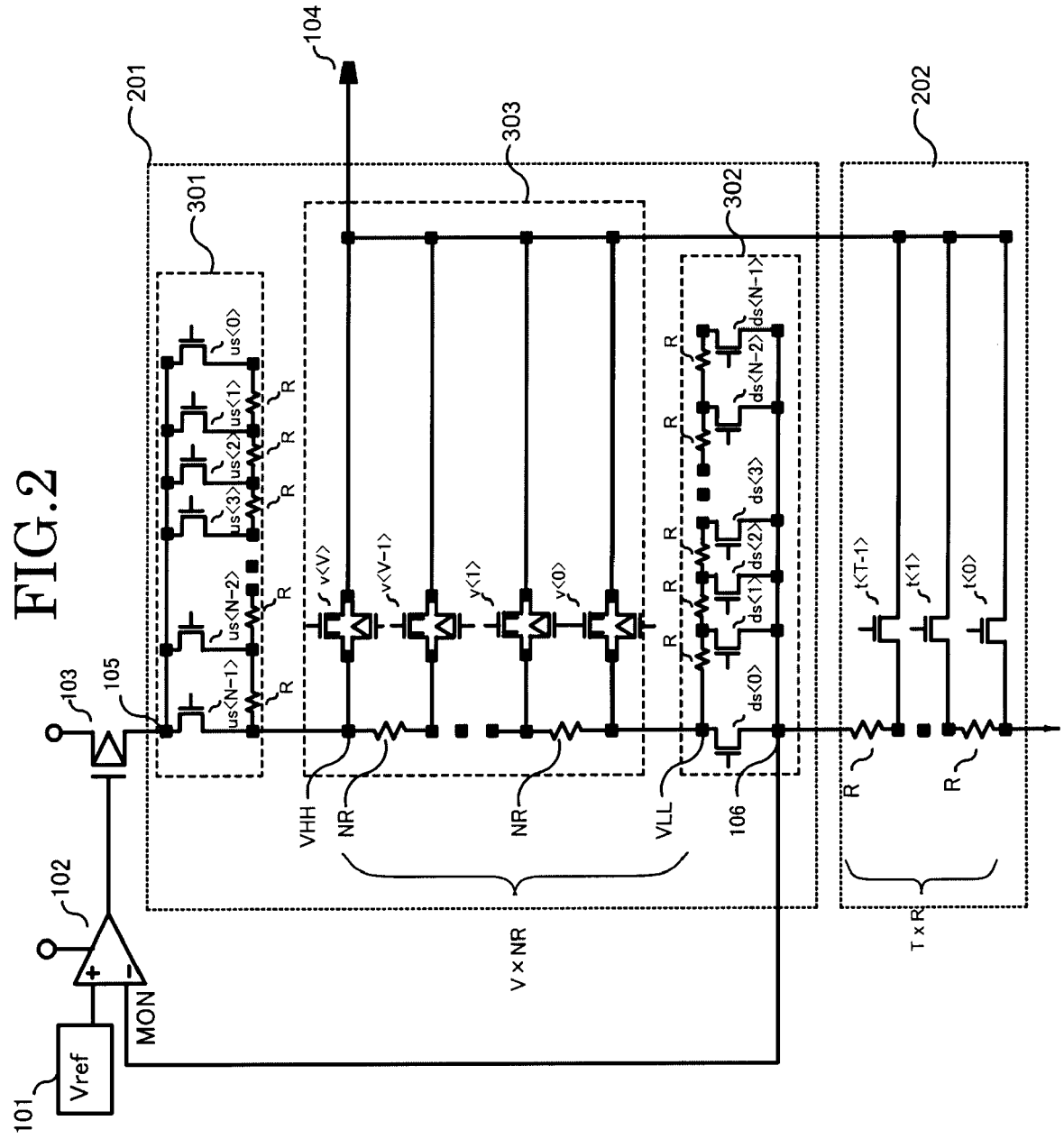
FIG. 2 is a circuit diagram of a voltage generation circuit according to a second embodiment of the present invention.

FIG. 2 is a circuit diagram of a voltage generation circuit according to a second embodiment of the present invention. In the example shown in FIG. 2, signals are provided in stages for controlling N switching transistors us<0> through us<N−1>, N switching transistors ds<0> through ds<N−1>, and V transfer gates v<0> through v<V>. Thus, the number of required transfer gates is reduced.

A plurality of resistors R connected between the MON and VLL have the same resistance R. By selecting one of the switching transistors ds<0> through ds<N−1>, the resistance between the MON and VLL becomes 0R, 1R, 2R, . . . or (N−1)R. A circuit including the plurality of resistors R and the plurality of switching transistors ds<0> through ds<N−1> is referred to as a second resistance selection circuit 302.

A plurality of resistors NR connected between the VLL and VHH have the same resistance, which is N times as much as the resistance R. By selecting one of the transfer gates v<0> through v<V>, the resistance between the VLL and VHH becomes 0NR, 1NR, . . . (V−1)NR, or VNR. A circuit including the plurality of resistors NR and the plurality of transfer gates v<0> through v<V> is referred to as a third resistance selection circuit 303.

A plurality of resistors R connected between the VHH and the drain 105 of the P-channel MOS transistor (MP1) 103 have the same resistance R. By selecting one of the switching transistors us<0> through us<N−1>, the resistance between the VHH and the drain 105 of the P-channel MOS transistor (MP1) 103 becomes (N−1)R, . . . 2R, 1R, or 0R. A circuit including the plurality of resistors and the plurality of switching transistors us<0> through us<N−1> is referred to as a first resistance selection circuit 301. The first through third resistance selection circuits 301 through 303 are included in a first voltage adjusting circuit 201. In FIG. 2, reference numeral 202 represents a second voltage adjusting circuit. The second voltage adjusting circuit includes a plurality of switching transistors t<0> through t<T−1> and a plurality of resistors R having the same resistance R.

A resistance between the drain 105 of the P-channel MOS transistor (MP1) 103 and the output node 104 is represented as Ru. The resistance between the output node 104 and the MON 106 is represented as Rd. In order to keep Rd+Ru constant, when one of the switching transistors us<0> through us<N−1> is selected such that the resistance between the VHH and the P-channel MOS transistor (MP1) 103 is (N−1)R, . . . 2R, 1R, or 0R, one of the switching transistors ds<0> through ds<N−1>R is selected such that the resistance between VLL and the MON is 0R, 1R, 2R, . . . or (N−1)R.

The switching transistors are controlled such that when the resistance between the MON and VLL is 0R, the resistance between the VHH and the drain 105 of the P-channel MOS transistor (MP1) 103 is (N−1)R, and such that when the resistance between the MON and VLL is 1R, the resistance between the VHH and the drain 105 of the P-channel MOS transistor (MP1) 103 is (N−2)R. The transfer gates v<0> through v<V> are also controlled such that one of the transfer gates v<0> through v<V> is activated. By controlling the switching transistors us<0> through us<N−1>, the switching transistors us<0> through ds<N−1> and the transfer gates v<0> through v<V> in this manner, the resistance between the MON and the drain 105 of the P-channel MOS transistor (MP1) 103 is constant at (N−1)R+VNR.

In the VCGRV<Vref mode, the voltage VCGRV at the output node 104 is represented by the following expression (5).

$$VCGRV = Vref \times (t/T) \qquad (5)$$

where t=0, 1, 2, . . . , T−1.

In the VCGRV≧Vref mode, the voltage VCGRV at the output node 104 is represented by the following expression (6).

$$VCGRV = Vref \times (1+(Nv+s)/T) \qquad (6)$$

where s=0, 1, 2, . . . , N−1; and v=0, 1, 2, . . . , V.

In this manner, the number of required transfer gates can be reduced to 1/N. The resistance is adjusted in a stepped-up manner by controlling a plurality of stages of switching transistor, i.e., the switching transistors us<0> through us<N−1> and the switching transistors ds<0> through ds<N−1>. Therefore, 2N switching transistors are additionally required. However, for outputting a voltage VCGRV of Vref or higher, the number of required transfer gates is reduced to 2N+V by such an arrangement, as opposed to NV transfer gates required conventionally. As the values of N and V are increased in order to provide the voltage levels with smaller steps, the effect by reducing the number of transfer gates is enhanced. For example, where N=16 and V=16, only 48 transfer gates are required as opposed to 256 transfer gates required conventionally.

FIG. 8 shows a relationship between sets of selection control signals ds<0> through ds<N-1>, us<0> through us<N-1> and V<0> through v<V>, and the level of the voltage VCGRV at the output node 104. The relationship is obtained in the VCGRV≧Vref mode by an exemplary voltage generation circuit according to the second embodiment of the present invention, in which V=2, N=4, T=8 and Vref=0.8V.

Embodiment 3

Figure 3:
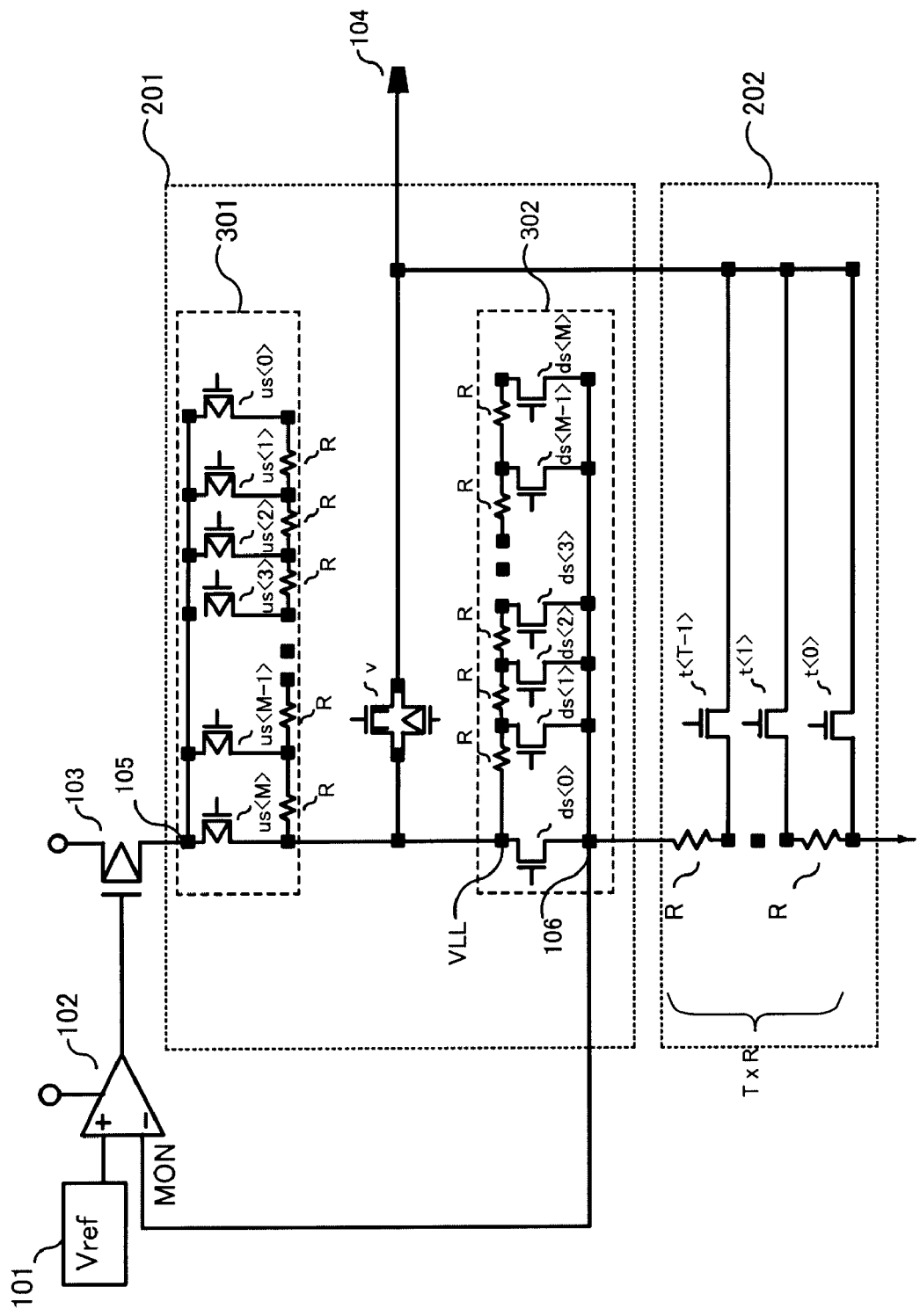
FIG. 3 is a circuit diagram of a voltage generation circuit according to a third embodiment of the present invention.

FIG. 3 is a circuit diagram of a voltage generation circuit according to a third embodiment of the present invention. The voltage generation circuit shown in FIG. 3 differs from the circuit of the second embodiment in that the circuit of the third embodiment includes no resistors NR and only one transfer gate. Switching transistors ds<0> through ds<M> and switching transistors us<0> through us<M> are controlled such that the resistance between the MON and the drain 105 of the P-channel MOS transistor (MP1) 103 is constant at MR.

In the VCGRV<Vref mode, the voltage VCGRV at the output node 104 is represented by the following expression (7).

$$VCGRV = Vref \times (t/T) \quad (7)$$

where t=0, 1, 2, . . . , T-1.

In the VCGRV≧Vref mode, the voltage VCGRV at the output node 104 is represented by the following expression (8).

$$VCGRV = Vref \times (1+(s)/T) \quad (8)$$

where s=0, 1, 2, . . . , M.

FIG. 9 shows a relationship between sets of selection control signals ds<0> through ds<M> and us<0> through us<M>, and the level of the voltage VCGRV at the output node 104. The relationship is obtained in the VCGRV≧Vref mode by an exemplary voltage generation circuit according to the third embodiment of the present invention, in which M=7, T=8 and Vref=0.8 V.

Embodiment 4

Figure 4:
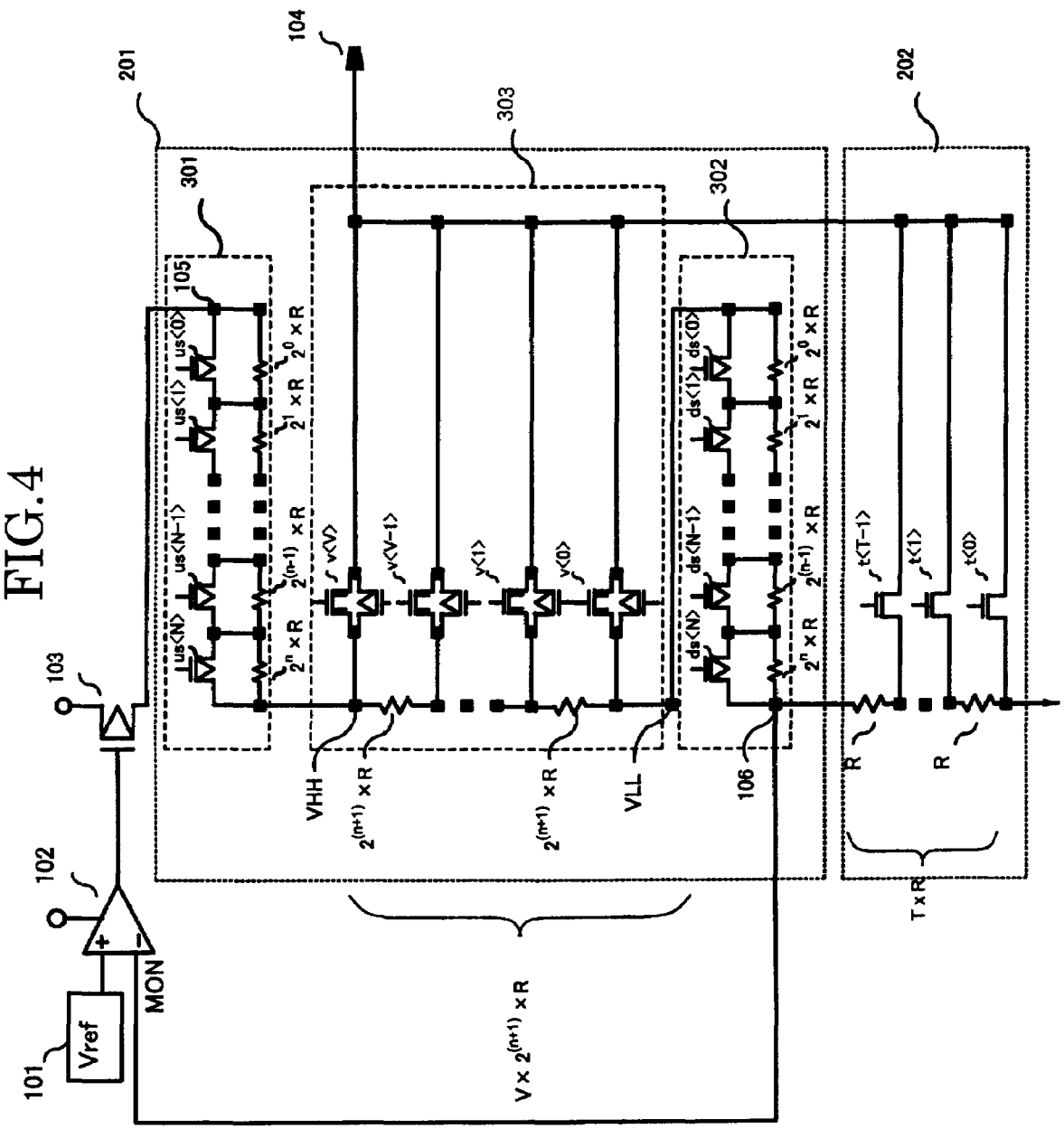
FIG. 4 is a circuit diagram of a voltage generation circuit according to a fourth embodiment of the present invention.

FIG. 4 is a circuit diagram of a voltage generation circuit according to a fourth embodiment of the present invention. The resistors in a first resistance selection circuit 301 are arranged such that the resistances thereof are sequentially $2^0 R, 2^1 R, 2^2 R, \ldots, 2^{(n-1)} R, 2^n R$. The resistors in the second resistance selection circuit 302 are also arranged such that the resistances thereof are sequentially $2^0 R, 2^1 R, 2^2 R, \ldots, 2^{(n-1)} R, 2^n R$.

The switching transistors us<0> through us<N> and the switching transistors ds<0> through ds<N> are arranged parallel to the resistors. A gate(s) of a part of the switching transistors us<0> through us<N> and a part of the switching transistors ds<0> through ds<N> is (are) selected by a binary signal.

The gates of the switching transistors ds<0> through ds<N> are controlled by a binary signal such that the resistance between the MON and VLL is 0R, 1R, 2R, . . . or $(2^{(N+1)}-1)R$. Between VLL and VHH, resistors each having a resistance of $2^{(N+1)}R$ are connected in series, and transfer gates v<0> through v<V> are connected to the respective connection nodes thereof and are selected. The gates of the switching transistors us<0> through us<N> are controlled by a binary signal such that the resistance between VHH and the drain 105 of the P-channel MOS transistor (MP1) 103 is $(2^{(N+1)}-1)R, \ldots, 2R, 1R$ or 0R.

When the resistance between the MON and VLL is 0R, the gates of the switching transistors us<0> through us<N> are controlled by a binary signal such that the resistance between VHH and the drain 105 of the P-channel MOS transistor (MP1) 103 is $(2^{(N+1)}-2)R$. When the resistance between the MON and VLL is 1R, the gates of the switching transistors us<0> through us<N> are controlled by a binary signal such that the resistance between VHH and the drain 105 of the P-channel MOS transistor (MP1) 103 is $(2^{(N+1)}-2)R$. By such a control, the resistance between the MON and the drain 105 of the P-channel MOS transistor (MP1) 103 is $(2^{(N+1)}-1)R + V \cdot 2^{(N+1)}R$.

In the VCGRV<Vref mode, the voltage VCGRV at the output node 104 is represented by the following expression (9).

$$VCGRV = Vref \times (t/T) \quad (9)$$

where t=0, 1, 2, . . . , T-1.

In the VCGRV≧Vref mode, the voltage VCGRV at the output node 104 is represented by the following expression (10).

$$VCGRV = Vref \times (1+(2^{(N+1)}v+s)/T) \quad (10)$$

where s=0, 1, 2, . . . , $(2^{(N+1)}-1)$ and v=0, 1, 2, . . . , V.

In this manner, the number of transfer gates can be reduced to $\frac{1}{2}^{(N+1)}$. Since the resistance is adjusted in a stepped-up manner by controlling the switching transistors ds<0> through ds<N> and the switching transistors us<0> through us<N> using a binary signal as well as by controlling the transfer gates, 2(N+1) switching transistors are additionally required. However, when the output node 104 outputs a voltage VCGRV of Vref or higher, the number of required transfer gates is reduced to 2(N+1)+V by such an arrangement, as opposed to $2^{(N+1)}V$ transfer gates required conventionally. As the values of N and V are increased, the effect by reducing the number of transfer gates is enhanced. For example, where N=3 and V=16, only 24 transfer gates are required as opposed to 256 transfer gates required conventionally.

FIG. 10 shows a relationship between sets of selection control signals ds<0> through ds<N>, us<0> through us<N> and V<0> through v<V>, and the level of the voltage VCGRV at the output node 104. The relationship is obtained in the VCGRV≧Vref mode by an exemplary voltage generation circuit according to the fourth embodiment of the present invention, in which V=2, N=2, T=8 and Vref=0.8 V.

Embodiment 5

Figure 5:
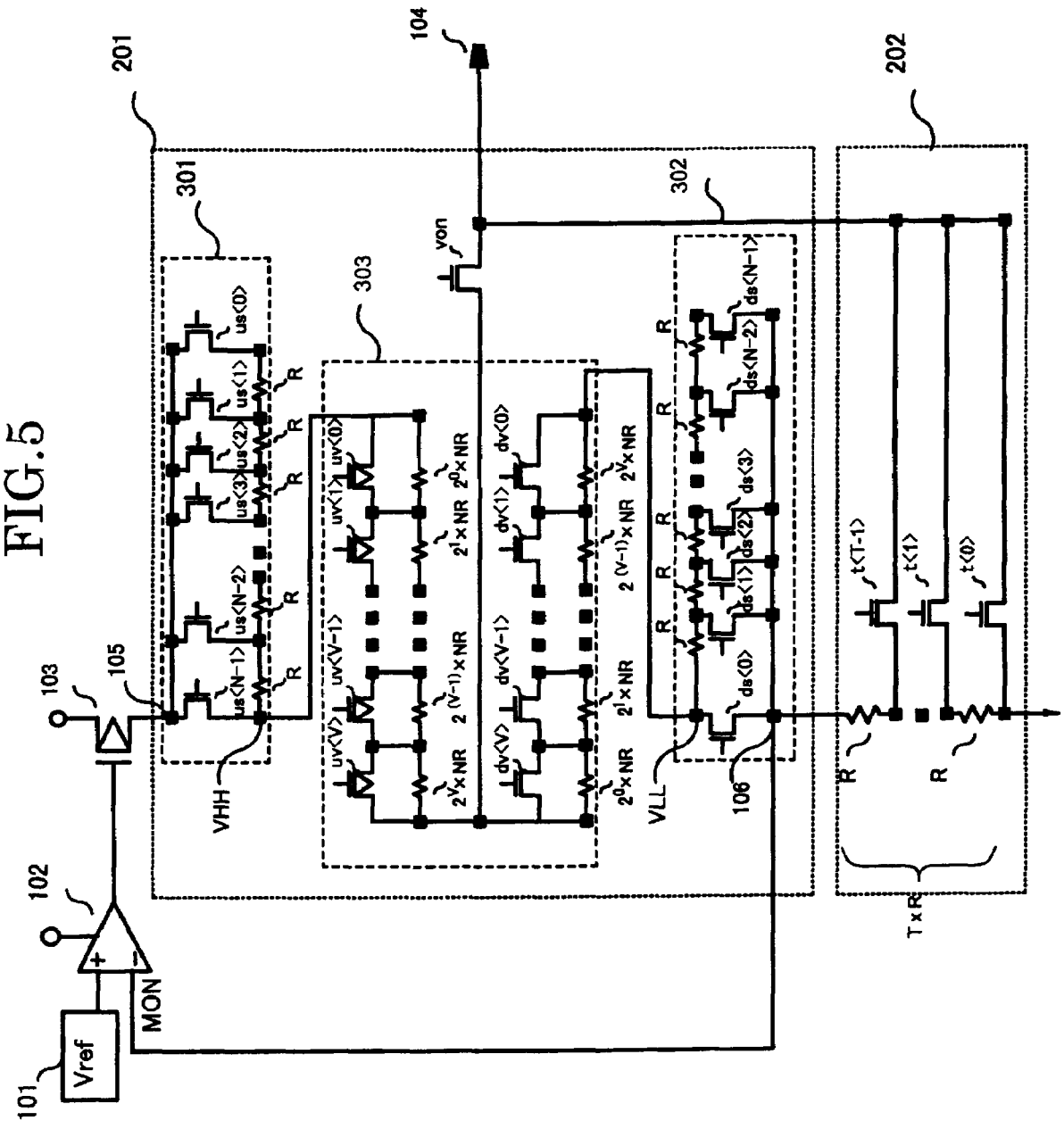
FIG. 5 is a circuit diagram of a voltage generation circuit according to a fifth embodiment of the present invention.

FIG. 5 is a circuit diagram of a voltage generation circuit according to a fifth embodiment of the present invention. A first resistance selection circuit 301 includes a plurality of resistors having the same resistance R which are arranged in series. The switching transistors us<0> through us<N-1> are controlled such that the resistance of the resistors connected in series is 0R, 1R, 2R, . . . or (N-1)R.

A second resistance selection circuit 302 includes a plurality of resistors having the same resistance R which are arranged in series. The switching transistors ds<0> through ds<N-1> are controlled such that the resistance of the resistors connected in series is (N-1)R, . . . , 2R 1R or 0R.

A third resistance selection circuit 303 includes a plurality of resistors arranged upward and downward with respect to a node connected to the output node 104 via a switching transistor von. The resistors provided upward with respect to the connection node are arranged such that the resistances thereof are sequentially $2^V$ N R, $2^{(V-1)}$ N R ..., $2^2$ N R, $2^1$ N R, $2^0$ N R. The resistors provided downward with respect to the connection node are arranged such that the resistances thereof are sequentially $2^0$ N R, $2^1$ N R, $2^2$ N R, ..., $2^{(v-1)}$ N R, $2^v$ N R. Switching transistors uv<0> through uv<V> are connected parallel to the resistors arranged upward with respect to the connection node von, and switching transistors dv<0> through dv<V> are connected parallel to the resistors arranged downward with respect to the connection node von. The switching transistors uv<0> through uv<V> and the switching transistors dv<0> through dv<V> are controlled by a binary signal such that the resistance of the upper stage resistors and the resistance of the lower stage resistors are each 0NR, 1NR, 2NR, ..., or (V−1)NR, and such that the resistance of the entire third resistance selection circuit is $2^{(v+1)}$·R.

The switching transistors are controlled such that when the resistance between the MON and VLL is 0R, the resistance between the VHH and the drain 105 of the P-channel MOS transistor (MP1) 103 is (N−1)R, and such that when the resistance between the MON and VLL is 1R, the resistance between the VHH and the drain 105 of the P-channel MOS transistor (MP1) 103 is (N−2)R. By such a control, the resistance between the drain 105 of the P-channel MOS transistor (MP1) 103 and the MON becomes (N−1)R+($2^{(v+1)}$−1)R.

In the VCGRV<Vref mode, the voltage VCGRV at the output node 104 is represented by the following expression (11).

$$VCGRV = V\text{ref} \times (t/T) \quad (11)$$

where t=0, 1, 2, ..., T−1.

In the VCGRV≧Vref mode, the voltage VCGRV at the output node 104 is represented by the following expression (12).

$$VCGRV = V\text{ref} \times (1+(Nv+s)/T) \quad (12)$$

where s=0, 1, 2, ..., N−1; and v=0, 1, 2, ..., $2^{(V+1)}$−1.

In this manner, the number of required transfer gates can be reduced to $\frac{1}{2}^{(N+1)}$. Since the gates are selected by a binary signal, 2N gates are additionally required. However, for outputting a voltage VCGRV of Vref or higher, the number of required transfer gates is reduced to 2N+2(V+1) by such an arrangement, as opposed to N($2^{(V+1)}$) transfer gates required conventionally. As the values of N and V are increased, the effect by reducing the number of transfer gates is enhanced. For example, where N=16 and V=3, only 40 transfer gates are required as opposed to 256 transfer gates required conventionally.

FIG. 11 shows a relationship between sets of selection control signals ds<0> through ds<N>, us<0> through us<N>, uv<0> through uv<V>, dv<0> through dv<V>, and the level of the voltage VCGRV at the output node 104. The relationship is obtained in the VCGRV≧Vref mode by an exemplary voltage generation circuit according to the fifth embodiment of the present invention, in which V=1, N=4, T=8 and Vref=0.8 V.

Embodiment 6

Figure 6:
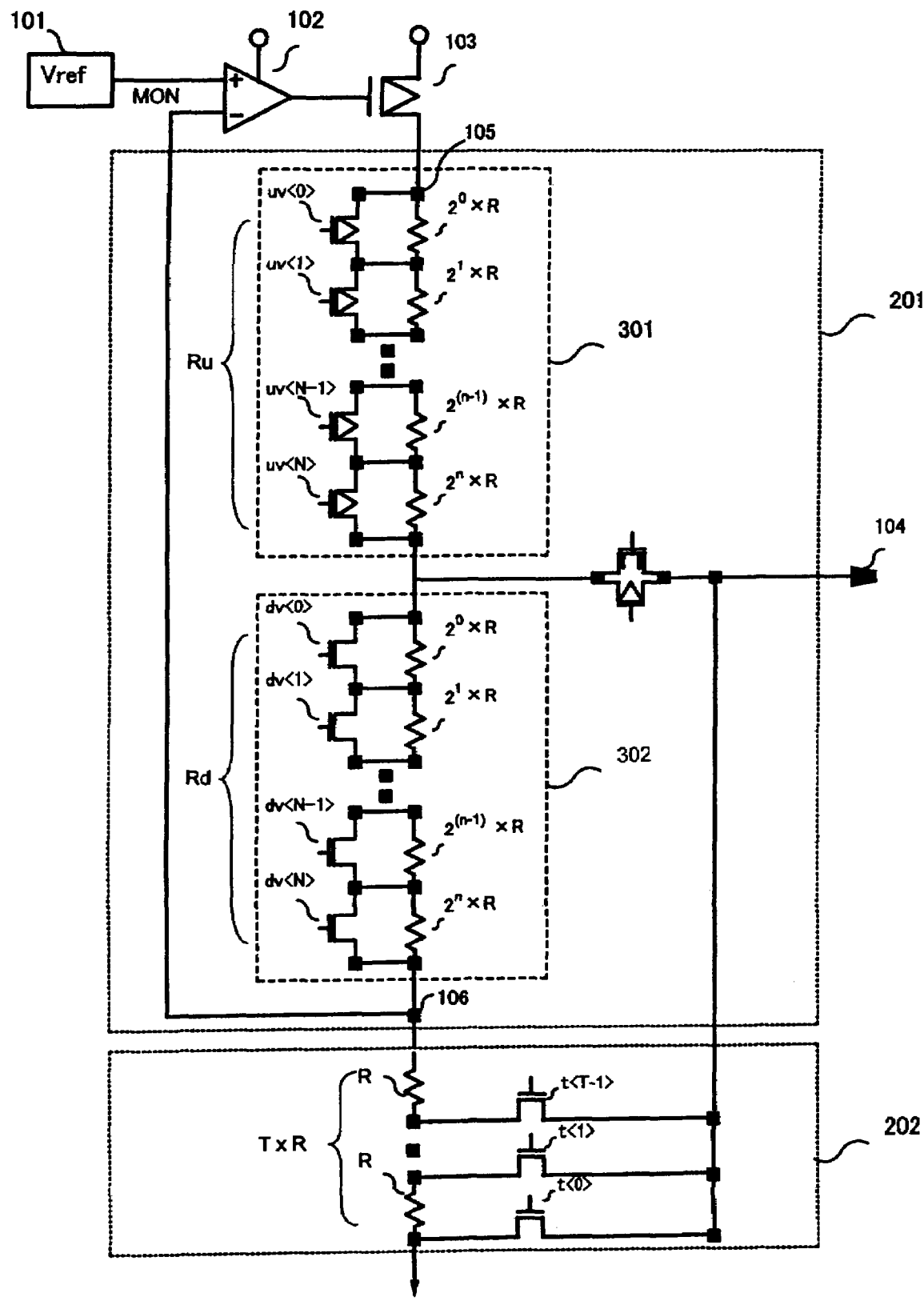
FIG. 6 is a circuit diagram of a voltage generation circuit according to a sixth embodiment of the present invention.

FIG. 6 is a circuit diagram of a voltage generation circuit according to a sixth embodiment of the present invention. A first resistance selection circuit 301 and a second resistance selection circuit 302 shown in FIG. 6 are controlled by a binary signal. These circuits are controlled such that even if the resistances of the first resistance selection circuit 301 and the second resistance selection circuit 302 vary in a plurality of patterns, the sum of the resistances of the first resistance selection circuit 301 and the second resistance selection circuit 302 is kept constant.

In the VCGRV<Vref mode, the voltage VCGRV at the output node 104 is represented by the following expression (13).

$$VCGRV = V\text{ref} \times (t/T) \quad (13)$$

where t=0, 1, 2, ..., T−1.

In the VCGRV≧Vref mode, the voltage VCGRV at the output node 104 is represented by the following expression (14).

$$VCGRV = V\text{ref} \times (1+(v/T)) \quad (14)$$

where v=0, 1, 2, ..., $2^{(N+1)}$−1.

In this manner, the number of required transfer gates can be reduced to $\frac{1}{2}^{(N+1)}$. For outputting a voltage VCGRV of Vref or higher, the number of required transfer gates is reduced to 2N by such an arrangement, as opposed to $2^{(N+1)}$ transfer gates required conventionally. As the value of N is increased, the effect by reducing the number of transfer gates is enhanced. For example, where N=8, only 16 transfer gates are required as opposed to 256 transfer gates required conventionally.

FIG. 12 shows a relationship between sets of selection control signals dv<0> through dv<V> and uv<0> through uv<V>, and the level of the voltage VCGRV at the output node 104. The relationship is obtained in the VCGRV≧Vref mode by an exemplary voltage generation circuit according to the sixth embodiment of the present invention, in which N=2, T=8 and Vref=0.8 V.

Embodiment 7

Figure 7:
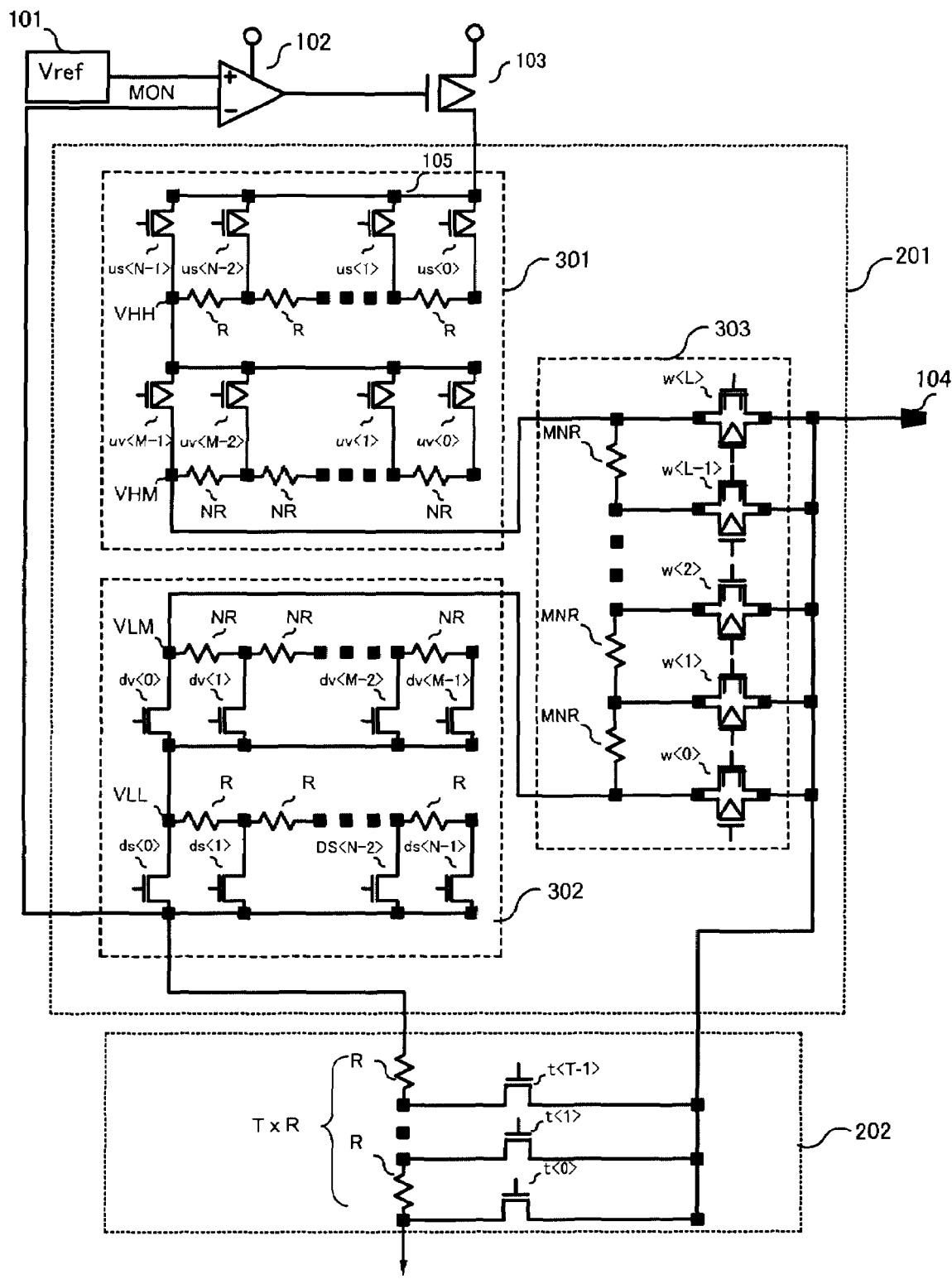
FIG. 7 is a circuit diagram of a voltage generation circuit according to a seventh embodiment of the present invention.

FIG. 7 is a circuit diagram of a voltage generation circuit according to a seventh embodiment of the present invention. Three stages of selection control signals are provided to reduce the number of transfer gates. Signals used in this circuit include signals ds<0> through ds<N−1> for controlling the resistance between the MON and VLL to be 0R, 0R, 2R, ... or signals (N−1)R, dv<0> through dv<M−1> for controlling the resistance between VLL and VLM to be 0NR, 1NR, 2NR, ... or signals (M−1)NR, and w<0> through w<L> for controlling transfer gates each of which are arranged for each of L resistors MNR to connect to VCGRV.

In order to keep constant the sum of the resistances between the drain 105 of the P-channel MOS transistor (MP1) 103 and the MON, the resistance between VHM and VHH is controlled to be (M−1)NR, ..., 2NR, 1NR or 0NR, and also the resistance between VHH and the drain 105 of the P-channel MOS transistor (MP1) 103 is controlled to be (N−1)R, ..., 2R, 1R or 0R. The sum of the resistances between the drain 105 of the P-channel MOS transistor (MP1) 103 and the MON 106 is (Ru+RD)=(N−1)R+(M−1)NR+LMNR.

In the VCGRV≧Vref mode, the voltage VCGRV at the output node 104 is represented by the following expression (15).

$$VCGRV = V\text{ref} \times (t/T) \quad (15)$$

where t=0, 1, 2, ..., T−1.

In the VCGRV≧Vref mode, the voltage VCGRV at the output node 104 is represented by the following expression (16).

$$VCGRV = V\text{ref} \times (1+(NMw+NV+s)/T) \quad (16)$$

where s=0, 1, 2, . . . , N−1; v=0, 1, 2, . . . , M−1; and w=0, 1, 2, . . . , L.

In this manner, the number of required transfer gates can be reduced to 1/NM. For adjusting the output voltage by providing s signals and v signals in stages, 2 (N+M) gates are additionally required. However, for outputting a voltage VCGRV of Vref or higher, the number of required transfer gates is reduced to 2(N+M)+V by such an arrangement, as opposed to NML transfer gates required conventionally. As the values of N, M and L are increased, the effect by reducing the number of transfer gates is enhanced. For example, where N=8, M=8 and L=8, only 40 transfer gates are required as opposed to 512 transfer gates required conventionally.

FIG. 13 shows a relationship between sets of election control signals with the level of the voltage VCGRV at the output node 104. The relationship is obtained in the VCGRV≧Vref mode by an exemplary voltage generation circuit according to the seventh embodiment of the present invention, in which L=3, M=3, N=4, T=8 and Vref=0.8 V.

The present invention is not limited to the above-described embodiments. Needless to say, three stages of switching transistors may be provided to be selected by a binary signal. Four or more stages of switching transistors may be provided to be selected.

In the above embodiments, in the case where the switching transistors used for the first resistance selection circuit, the second resistance selection circuit and the third resistance selection circuit are N-channel transistors, the N-channel transistors may be replaced with P-channel transistors. In this case, inverters may be inserted at inputs of the gates of the transistors.

Embodiment 8

Figure 15:
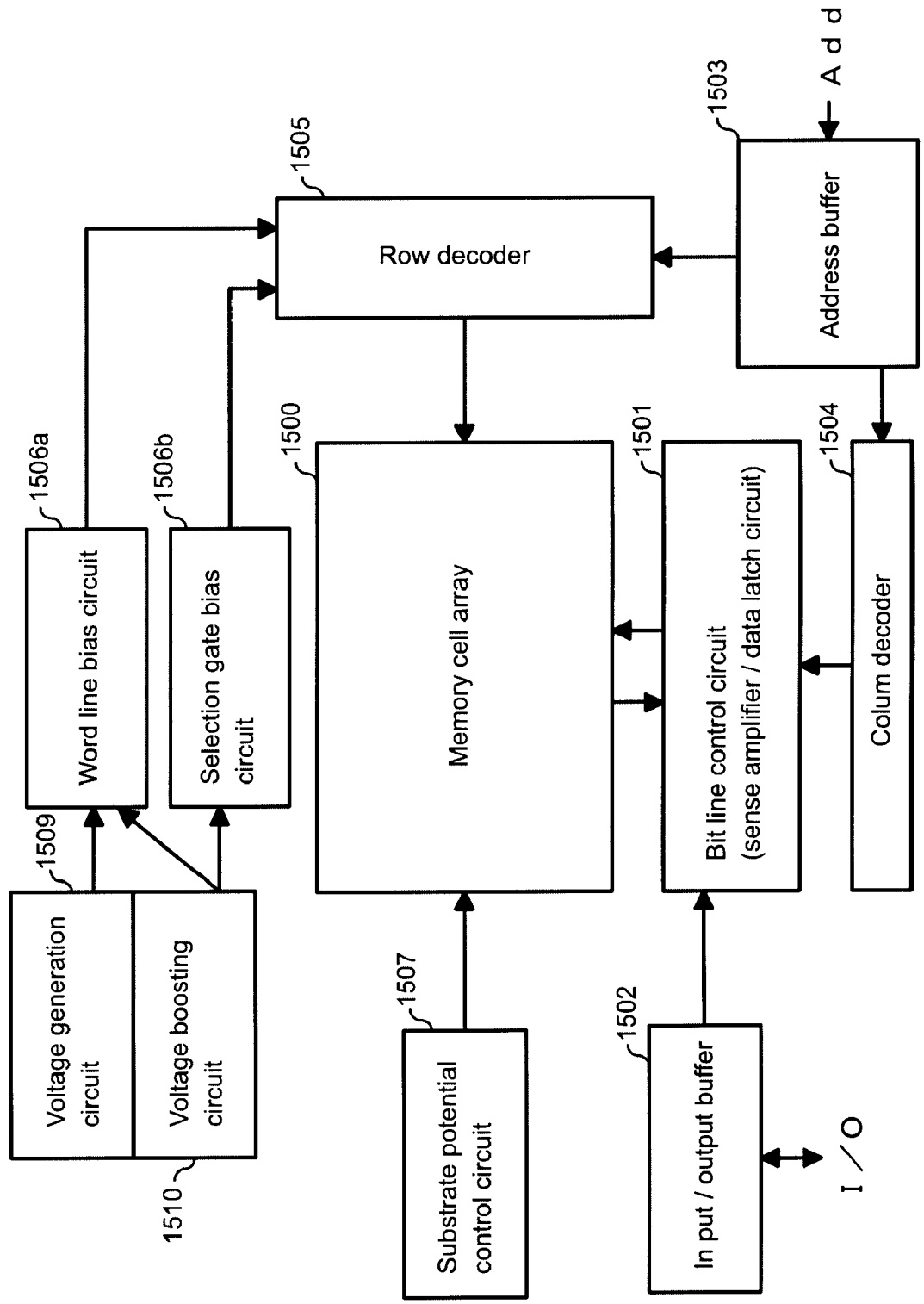
FIG. 15 is a block diagram of a semiconductor memory device according to an eighth embodiment of the present invention.

FIG. 15 is a block diagram of a semiconductor memory device according to an eighth embodiment of the present invention. In the eighth embodiment, a voltage generation circuit described in any of the first through seventh embodiments is actually applied in a semiconductor memory device. FIG. 15 shows a structure of the semiconductor memory device. In a memory cell array 1500, a plurality of nonvolatile memory cells connected in series are arranged in a matrix.

A bit line control circuit 1501 is provided for sensing bit line data from the memory cell array 1500 or retaining data to be written onto the memory cell array 1500. The bit line control circuit 1501 includes a sense amplifier circuit and a data latch circuit, and for example, mainly includes flip-flop circuits.

The bit line control circuit 1501 is connected to a data input/output buffer 1502. This connection is controlled by an output from a column decoder 1504 for decoding an address signal from an address buffer 1503. Thus, data given to a data input/output terminal I/O can be written onto the memory cell array 1500, and data in the memory cell array 1500 can be read into the data input/output terminal I/O.

In order to select a memory cell in the memory cell array 1500, specifically in order to control data control lines (hereinafter, referred to as "word lines") WL (not shown) and selection gate lines SSL and GSL (not shown), a word line bias circuit 1506a and a selection gate bias circuit 1506b, and a row decoder 1505 are provided. The word line bias circuit 1506a and the selection gate bias circuit 1506b provide a control voltage required by the selected word line and selection gate line.

A substrate potential control circuit 1507 is provided for controlling the potential of a substrate area (usually, a p-type well) on which the memory cell array 1500 is provided. Specifically, the substrate potential control circuit 1507 generates a ground potential GND for writing or reading data, and generates an erase voltage for erasing data.

A voltage generation circuit 1509 is provided for generating various internal voltages for supplying a selected memory cell in the memory cell array 1500 with a necessary voltage for writing or reading data. Specifically, the voltage generation circuit 1509 generates a write voltage (Vpgm), a pass voltage (Vpass) for data write, a pass voltage (Vread) for data read (including data verification) and a read voltage (Vr).

The pass voltage for data write and the pass voltage for data read are lower than the write voltage, but is higher than the supply voltage Vcc.

A voltage setting circuit shown in any of the first through seventh embodiments of the present invention is, for example, provided for setting an initial voltage, which is for generating write voltage pulses sequentially stepped up for data write, and for varying the levels of the write voltage (Vpgm). Preferably, a voltage setting circuit for varying the pass voltage Vpass for data write and the pass voltage Vread for data read in accordance with the varied write voltage Vpgm is also provided.

In this embodiment, the levels of the stepped-up voltages generated by the voltage generation circuit 1509 are controlled by a dividing ratio using the resistors. The voltage generation circuit 1509 is controlled such that the total resistance of the resistors is constant even if the generated voltages are of different levels. The voltage generation circuit 1509 uses a plurality of levels of signals for controlling the resistance and thus reduces the number of transfer gates. As a result, the circuit area of the semiconductor memory device can be reduced.

We claim:

1. A voltage generation circuit, comprising:
    a reference voltage generation circuit for generating a reference voltage;
    a differential amplifier having a first input terminal to which the reference voltage is input, a second input terminal, and an output terminal;
    an output node for outputting an output voltage;
    a P-channel MOS transistor having a source to which a power supply is connected, a drain, and a gate to which the output terminal of the differential amplifier is connected;
    a first resistor series connected between the drain of the P-channel MOS transistor and the output node;
    a second resistor series connected between the output node and the second input terminal of the differential amplifier;
    a third resistor series connected between the second input terminal of the differential amplifier and a ground; and
    a selection control circuit for selecting a resistance of the first resistor series, a resistance of the second resistor series, and a resistance of the third resistor series, and when controlling the resistance of the first resistor series and the resistance of the second resistor series to be different from each other, the selection control circuit controls such that a sum of the resistances of the first resistor series and the second resistor series is constant.

2. A voltage generation circuit, comprising:
    a reference voltage generation circuit for generating a reference voltage;
    a differential amplifier having a first input terminal to which the reference voltage is input, a second input terminal, and an output terminal;

a P-channel MOS transistor having a source to which a power supply is connected, a drain, and a gate to which the output terminal of the differential amplifier is connected;

an output node for outputting an output voltage;

a first voltage adjusting circuit connected between the drain of the P-channel MOS transistor and the second input terminal of the differential amplifier, the first voltage adjusting circuit comprising:

a first resistance selection circuit including a plurality of switching transistors and a plurality of resistors provided on a stage upward with respect to the output node, a second resistance selection circuit including a plurality of switching transistors and a plurality of resistors provided on a stage downward with respect to the output node, and a third resistance selection circuit including a plurality of transfer gates and a resistor selectively connected to the output node, wherein when controlling the resistance of the plurality of resistors of the first resistance selection circuit and the resistance of the plurality of resistors of the second resistance selection circuit to be different from each other, the first voltage adjusting circuit controls such that a sum of the resistances of the first resistance selection circuit and the second resistance selection circuit is constant; and a second voltage adjusting circuit connected between the second input terminal of the differential amplifier and a ground.

3. A voltage generation circuit according to claim 2, wherein the first voltage adjusting circuit switches a combination of resistors among the plurality of resistors in the first and second resistance selection circuits in accordance with selection made on one or more of the plurality of transfer gates and the plurality of switching transistors, thus to adjust the voltage at the output node.

4. A voltage generation circuit according to claim 2, wherein the second voltage adjusting circuit includes a plurality of resistors each having a resistance equal to the resistance of each of the plurality of switching transistors in the second voltage adjusting circuit.

5. A voltage generation circuit according to claim 4, wherein the second voltage adjusting circuit switches a combination of resistors among the plurality of resistors in the second voltage adjusting circuit in accordance with selection made on the plurality of switching transistors, thus to adjust a voltage at the output node.

6. A voltage generation circuit according to claim 2, wherein the resistors included in the first resistance selection circuit and the resistors included in the second resistance selection circuit have a resistance equal to the resistance of the resistors included in the second voltage adjusting circuit.

7. A voltage generation circuit according to claim 2, wherein the resistors included in the third resistance selection circuit each has a resistance equal to a resistance obtained by multiplying the number (N) of the resistors included in the first resistance selection circuit or the second resistance selection circuit by the resistance (R) of the resistors included in the first or second resistance selection circuit.

8. A voltage generation circuit according to claim 2, wherein the resistors included in the first resistance selection circuit are arranged such that the resistance of each thereof is a value obtained by multiplying $2^U$ by the resistance R, where U is sequentially increased as 0, 1, 2, . . . , N−1, N with distance from the drain of the P-channel MOS transistor.

9. A voltage generation circuit according to claim 2, wherein the resistors included in the second resistance selection circuit are arranged such that the resistance of each thereof is a value obtained by multiplying $2^L$ by the resistance R, where L is sequentially decreased as N, N−1, . . . , 2, 1, 0 with distance from the second input terminal of the differential amplifier.

10. A voltage generation circuit according to claim 2, wherein the resistors included in the third resistance selection circuit each has a resistance obtained by multiplying $2^{(N+1)}$ by the resistance R.

11. A voltage generation circuit according to claim 2, wherein the number of the resistors included in the first resistance selection circuit and the number of the resistors included in the second resistance selection circuit are identical to each other, and the resistance of each of the resistors is equal to the resistance of each of the resistors included in the second voltage adjusting circuit.

12. A voltage generation circuit according to claim 2, wherein the third resistance selection circuit further includes a plurality of switching transistors and a plurality of resistors.

13. A voltage generation circuit according to claim 2, wherein V+1 resistors are connected between the first resistance selection circuit and the output node and arranged, such that the resistance of each thereof is a value of $(2^v)NR$, where NR is a resistance and v is sequentially increased as 0, 1, 2, 3, . . . , V with distance from the first resistance selection circuit.

14. A voltage generation circuit according to claim 2, wherein V+1 resistors are connected between the output node and the second resistance selection circuit and arranged, such that the resistance of each thereof is a value of $(2^v)NR$, where NR is a resistance and v is sequentially increased as 0, 1, 2, 3, . . . , V with distance from the output node.

15. A voltage generation circuit according to claim 2, wherein the resistors included in the third resistance selection circuit are arranged, such that the resistance of each thereof has a value of $(2^v)NR$, where NR is a resistance and v is sequentially changed as 0, 1, 2, 3, . . . , V in one direction and V, V−1, . . . , 3, 2, 1, 0 in another direction, from the value for the resistor connected to the output node.

* * * * *